United States Patent
Kirkby et al.

(10) Patent No.: US 12,115,564 B2
(45) Date of Patent: Oct. 15, 2024

(54) ULTRASONIC CLEANING METHOD

(71) Applicant: YAMAHA ROBOTICS HOLDINGS CO., LTD., Tokyo (JP)

(72) Inventors: Michael Kirkby, Tokyo (JP); Ysmaldo Jose Landaez Garcia, Tokyo (JP); Hiroshi Munakata, Tokyo (JP)

(73) Assignee: YAMAHA ROBOTICS HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 18/022,270

(22) PCT Filed: Aug. 26, 2021

(86) PCT No.: PCT/JP2021/031274
§ 371 (c)(1),
(2) Date: Feb. 20, 2023

(87) PCT Pub. No.: WO2023/026422
PCT Pub. Date: Mar. 2, 2023

(65) Prior Publication Data
US 2024/0269716 A1     Aug. 15, 2024

(51) Int. Cl.
*B08B 3/12*     (2006.01)
*B08B 7/00*     (2006.01)
(Continued)

(52) U.S. Cl.
CPC .............. *B08B 3/12* (2013.01); *B08B 7/0014* (2013.01); *B08B 7/04* (2013.01); *H01L 21/02079* (2013.01)

(58) Field of Classification Search
CPC ... H01L 21/02079; B08B 3/12; B08B 7/0014; B08B 7/04; B08B 7/028; B08B 7/026
See application file for complete search history.

(56) References Cited

U.S. PATENT DOCUMENTS 5,368,054 A   11/1994  Koretsky et al.
5,562,778 A * 10/1996  Koretsky .......... H01L 21/67051
                                              134/32
(Continued)

FOREIGN PATENT DOCUMENTS

JP   H07201799    8/1995
JP   2000117201   4/2000
(Continued)

OTHER PUBLICATIONS

JP2010080531A machine translation (Year: 2010).*
(Continued)

*Primary Examiner* — Douglas Lee
(74) *Attorney, Agent, or Firm* — JCIPRNET

(57) ABSTRACT

An ultrasonic cleaning method of the invention includes: a cleaning liquid coating step (S101), coating a cleaning liquid on a front surface of an electronic component held on a cleaning stage; a pealing step (S103), irradiating the front surface of the electronic component coated with the cleaning liquid with ultrasonic waves from ultrasonic speakers installed to an acoustic head and peeling off a foreign matter attached to the front surface from the front surface; and an attracting step (S104), concentrating the ultrasonic waves generated from the ultrasonic speakers at a gap between a casing and a holding surface of the cleaning stage to form a low pressure region whose pressure is lower than atmospheric pressure at a central lower part of the casing, and attracting the foreign matter peeled off from the front surface of the electronic component and the cleaning liquid coated on the front surface.

4 Claims, 7 Drawing Sheets

(51) Int. Cl.
 *B08B 7/04* (2006.01)
 *H01L 21/02* (2006.01)

(56) References Cited

U.S. PATENT DOCUMENTS

| | | |
|---|---|---|
| 10,688,536 B2 | 6/2020 | Ponomarev |
| 10,953,440 B2 | 3/2021 | Okada et al. |
| 11,167,325 B2 | 11/2021 | Ponomarev |
| 2015/0239020 A1* | 8/2015 | Ponomarev ............. B24C 5/005 134/1 |

FOREIGN PATENT DOCUMENTS

| | | | |
|---|---|---|---|
| JP | 2010080531 A | * | 4/2010 |
| JP | 2012217876 A | * | 11/2012 |
| JP | 2016077936 | | 5/2016 |
| JP | 2017506157 | | 3/2017 |
| JP | 6307684 | | 4/2018 |
| JP | 2019153638 | | 9/2019 |

OTHER PUBLICATIONS

JP2012217876A machine translatio (Year: 2012).*
"International Search Report (Form PCT/ISA/210) of PCT/JP2021/031274," mailed on Oct. 12, 2021, pp. 1-3.

* cited by examiner

ULTRASONIC CLEANING METHOD

CROSS-REFERENCE TO RELATED APPLICATION

This application is a 371 application of the International PCT application serial no. PCT/JP2021/031274, filed on Aug. 26, 2021. The entirety of the above-mentioned patent application is hereby incorporated by reference herein and made a part of this specification.

TECHNICAL FIELD

The invention relates to an ultrasonic cleaning method cleaning a front surface of a cleaning target by using ultrasonic waves.

RELATED ART

There has been a demand for removing a foreign matter attached to the front surface of a semiconductor device such as an image sensor. A technique for removing foreign matters of a semiconductor device by using liquid $CO_2$ is used as such method for removing a foreign matter. According to this method, the liquid $CO_2$ is sprayed to the front surface of the cleaning target from a spray nozzle, and dry ice particles which are frozen due to adiabatic expansion at the time of spraying collide with the cleaning target to remove the foreign matters on the front surface (see, for example, Patent Document 1).

In addition, an ultrasonic cleaner in which a cleaning tank is filled with cleaning liquid, the cleaning target is immersed into the cleaning liquid, and the cleaning liquid is irradiated with ultrasonic waves to clean the cleaning target has been frequently used (see, for example, Patent Document 2).

CITATION LIST

Patent Literature

[Patent Literature 1] Japanese Patent Lain-Open No. 2000-117201
[Patent Literature 2] Japanese Patent No. 6307684

SUMMARY OF INVENTION

Technical Problem

However, in the method disclosed in Patent Document 1, a mechanism for freezing dry ice with a high purity is required. Therefore, the device is large and complicated. In addition, at the time of spraying the particles of dry ice, the semiconductor device may be damaged. Moreover, since the cleaning target needs to be put into and taken out of the cleaning tank in the ultrasonic cleaner using a cleaning tank as disclosed in Patent Document 2, it is difficult to be assembled to a semiconductor manufacturing apparatus such as a bonding apparatus.

Therefore, an objective of the invention is to suppress damages to a cleaning target as well as cleaning the cleaning target by using a simple configuration.

Solution to Problem

An ultrasonic cleaning method according to the invention is an ultrasonic cleaning method for cleaning a front surface of a cleaning target. The ultrasonic cleaning method includes: a preparation step, preparing an acoustic cleaning apparatus comprising: a cleaning stage, holding the cleaning target on a holding surface; and an acoustic head provided to be spaced apart from the cleaning stage and having: a plurality of ultrasonic wave generators being directional; and a casing to which the ultrasonic wave generators are installed, so that a plurality of ultrasonic waves generated from the acoustic generators are concentrated; a cleaning liquid coating step, coating a cleaning liquid on the front surface of the cleaning target held on the cleaning stage; a peeling step, after the cleaning liquid coating step, irradiating the front surface of the cleaning target coated with the cleaning liquid with the ultrasonic waves generated from the ultrasonic generators installed to the acoustic head, and peeling off a foreign matter attached to the front surface from the front surface; and an attracting step, concentrating the ultrasonic waves generated from the ultrasonic wave generators installed to the acoustic head at a gap between the casing and the holding surface of the cleaning stage to form a low pressure region whose pressure is lower than atmospheric pressure at the gap, and attracting the foreign matter peeled off from the front surface of the cleaning target and the cleaning liquid coated on the front surface to the low pressure region.

Accordingly, by irradiating the front surface of the cleaning target coated with the cleaning liquid with the ultrasonic waves generated by the ultrasonic generators, cavitation is generated in the cleaning liquid, and the foreign matter attached to the front surface of the cleaning target can be peeled off from the front surface through the pressure and vibration when bubbles collapse. In addition, the low pressure region is formed at the gap between the casing and the cleaning stage. By attracting the foreign matter peeled off from the front surface of the cleaning target and the cleaning liquid coated on the front surface to the low pressure region, the foreign matter and the cleaning liquid from the front surface of the cleaning target can be removed, and the front surface of the cleaning target can be cleaned. The ultrasonic cleaning method according to the invention is capable of removing a foreign matter without contacting the front surface of the cleaning target, and can suppress damages to the cleaning target. With a simple configuration, the front surface of the cleaning target can be cleaned.

In the ultrasonic cleaning method according to the invention, the acoustic cleaning apparatus prepared in the preparation step may include a movement mechanism moving relatively the acoustic head with respect to the cleaning target held on the cleaning stage. In addition, the ultrasonic cleaning method may include: in the peeling step, irradiating the front surface of the cleaning target with the ultrasonic waves while moving relatively the acoustic head with respect to the cleaning target held on the cleaning stage, via the gap, along the front surface; and in the attracting step, attracting the foreign matter peeled off from the front surface of the cleaning target and the cleaning liquid coated on the front surface to the low pressure region, while moving relatively the low pressure region above the front surface of the cleaning target held on the cleaning stage along the front surface.

Accordingly, the front surface of the cleaning target can be cleaned in a continuous manner.

The ultrasonic cleaning method according to the invention may also include: in the peeling step, moving the acoustic head so that a height of the low pressure region from the front surface is greater than a half of a wavelength of the ultrasonic wave; and in the attracting step, moving the acoustic head so that the height of the low pressure region from the front surface is equal to or less than a half of the wavelength of the ultrasonic wave. The attracting step may be executed after the peeling step.

Through the reflection of the ultrasonic waves from the cleaning target, the low pressure region is fixed at a height from a quarter to a half of the wavelength from the front surface of the cleaning target. The low pressure region is a region held in a low pressure state whose pressure is lower than the atmospheric pressure, and is a region where the pressure variation due to the vibration of the ultrasonic waves is little. Therefore, by moving the acoustic head so that the height of the low pressure region from the front surface is greater than a half of the wavelength of the ultrasonic waves, a region where the pressure variation due to the ultrasonic waves is greater can reach the front surface of the cleaning target, cavitation can be effectively generated in the cleaning liquid, and the peeling of the foreign matter can be facilitated. In addition, after the peeling of the foreign matter ends, by moving the acoustic head so that the height of the low pressure region from the front surface is equal to or less than a half of the wavelength of the ultrasonic waves to bring the front surface of the cleaning target close to the low pressure region, the foreign matter peeled off from the front surface of the cleaning target and the cleaning liquid can be effectively attracted to the low pressure region.

The ultrasonic cleaning method according to the invention may also include: moving the acoustic head so that a height of the low pressure region from the front surface is greater than a half of a wavelength of the ultrasonic wave and lower than the wavelength of the ultrasonic wave. The peeling step and the attracting step may be executed at a same time Accordingly, since the foreign matter peeled off from the front surface can be attracted to the low pressure region at the same time when cavitation is generated in the cleaning liquid coated on the front surface of the cleaning target, the cleaning speed can increase.

Effects of Invention

The invention is capable of suppressing damages to a cleaning target as well as cleaning the cleaning target by using a simple configuration.

DESCRIPTION OF EMBODIMENTS

Figure 1:
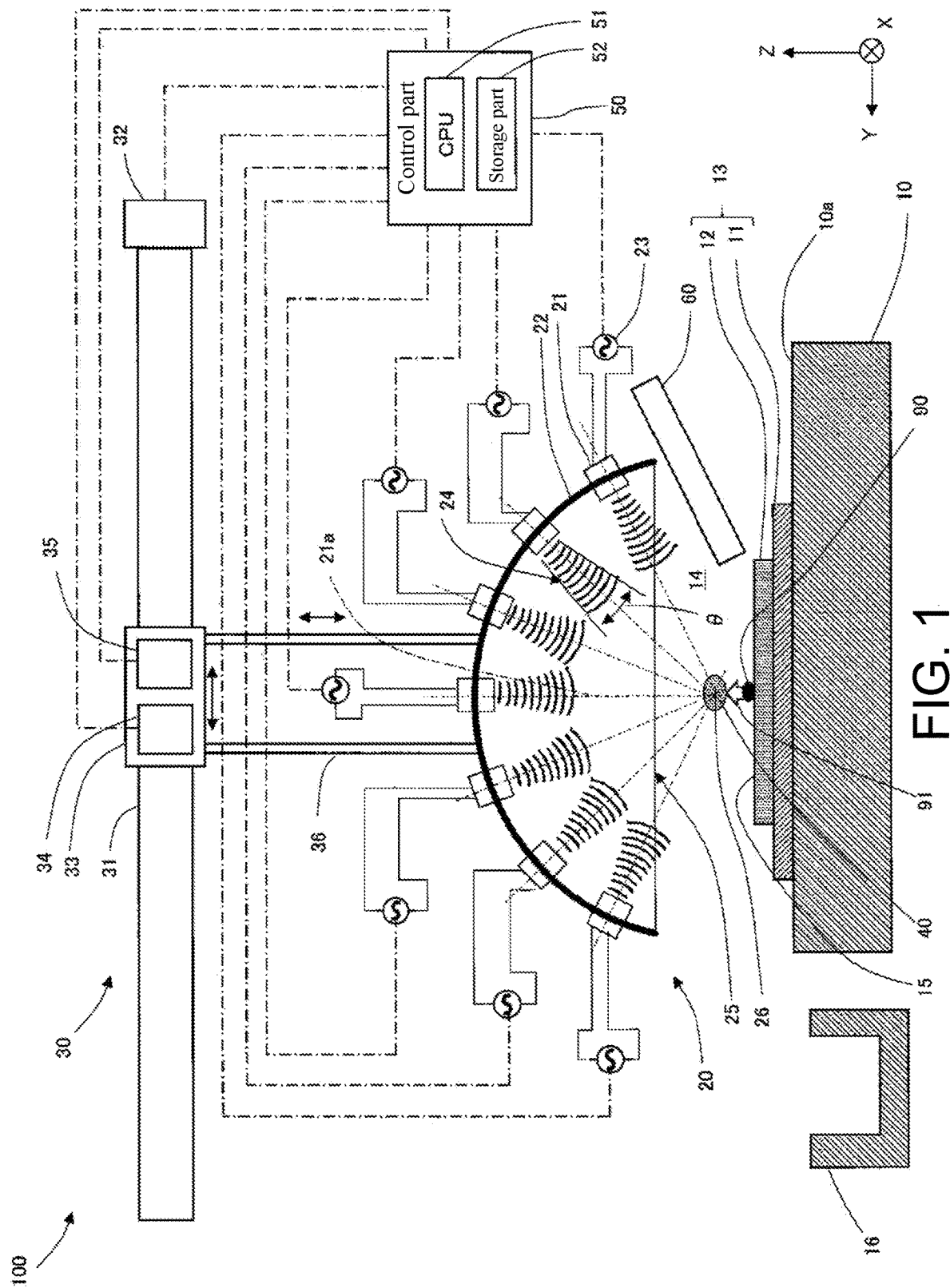
FIG. 1 is a perspective view illustrating a configuration of an acoustic cleaning apparatus executing an ultrasonic cleaning method according to an embodiment.

In the following, an ultrasonic cleaning method according to an embodiment will be described with reference to the drawings. To begin with, the configuration of an acoustic cleaning apparatus 100 executing the ultrasonic cleaning method according to the embodiment will be described with reference to FIG. 1. As shown in FIG. 1, the acoustic cleaning apparatus 100 includes a cleaning stage 10, an acoustic head 20, a movement mechanism 30, a foreign matter discarding part 16, and a cleaning liquid discharging nozzle 60. In the following description, a vertical direction with respect to the paper surface of FIG. 1 is set as X direction, a direction orthogonal to X direction on the horizontal surface is set as Y direction, and a top-down direction is set as Z direction.

The cleaning stage 10 is installed to a base not shown herein. The cleaning stage 10 attracts and holds an electronic component 13, which is the cleaning target, on a holding surface 10a on the upper side. The electronic component 13, for example, may also be an image sensor 12 installed on a substrate 11. The cleaning stage 10 is able to convey the electronic component 13 in X direction. In addition, the foreign matter discarding part 16 is arranged beside the cleaning stage 10. The foreign matter discarding part 16, for example, includes a vacuum attraction mechanism facing downward.

The acoustic head 20 spaced apart from the cleaning stage 10 is provided above the cleaning stage 10. The acoustic head 20 is formed by a casing 22 and multiple ultrasonic speakers 21 installed to the casing 22. The casing 22 of the acoustic head 22 is connected to the movement mechanism 30 moving relatively the acoustic head 20 with respect to the electronic component 13 attracted to and held on the cleaning stage 10.

The movement mechanism 30 is formed by a guide rail 31 installed to the base not shown herein to be movable in X direction and a slider 33 moving along the guide rail 31 along Y direction. The guide rail 31 is configured to be movable in X direction by an X direction movement mechanism 32. The slider 33 is configured to include a Y direction movement mechanism 34 inside, and to be guided by the guide rail 31 to be movable in Y direction. The casing 22 of the acoustic head 20 is connected to the slider 33 by an arm 36 extending in Z direction. The slider 33 is configured to include a Z direction movement mechanism 35 inside, which drives the arm 36 in Z direction, and to be able to move the acoustic head 20 in Z direction. Accordingly, the movement mechanism 30 is configured to be able to relatively move the acoustic head 20 in X, Y, and Z directions with respect to the electronic component 13 attracted to and held on the cleaning stage 10. In addition, the movement mechanism 30 is configured to be able to move the acoustic head 20 until the above of the foreign matter discarding part 16.

The casing 22 of the acoustic head 20 is in a spherical dome shape and the cleaning stage side on the lower side is open. A spherical center 26 of the spherical surface forming the casing 22 is at a central lower part of the casing 22 on the lower side with respect to an open surface 25, and is located at a gap 14 between the casing 22 and a holding surface 10a of the cleaning stage 10. The ultrasonic speaker 21 is a directional ultrasonic wave generator, and generates an ultrasonic wave 24 so that the ultrasonic wave 24 propagates in a range of a directivity angle θ with an axis 21a as the center in the direction of the axis 21a. The ultrasonic speakers 21 are installed to the casing 22 so that the respective axes 21a intersect at the spherical center 26 of the spherical surface of the casing 22. Therefore, the respective ultrasonic waves 24 generated from the ultrasonic speakers 21 intersect at the central lower part of the casing 22 at the location of the spherical center 26. Since the spherical center 26 is located at the gap 14 with the holding surface 10a of the cleaning stage 10, the respective ultrasonic waves 24 are concentrated at the gap 14.

A drive unit 23 driving each of the ultrasonic speakers 21 is connected to each of the ultrasonic speakers 21. Each drive unit 23 is able to adjust the phase of the ultrasonic wave 24 generated by the connected ultrasonic speaker 21. In addition, the multiple drive units 23 form a drive circuit driving an ultrasonic speaker group formed by the multiple ultrasonic speakers 21.

Beside the cleaning stage 10, a cleaning liquid discharge nozzle 60 able to move forward and backward above a front surface 15 of the electronic component 13 mounted on the cleaning stage 10 is provided. The cleaning liquid discharge nozzle 60 is supported by a drive mechanism not shown in the drawing, moves to scan above the front surface 15 of the image sensor 12 in XY direction, and coats a cleaning liquid 61 on the front surface 15 of the image sensor 12 from the tip.

The X direction movement mechanism 32, the Y direction movement mechanism 34, the Z direction movement mechanism 35 of the movement mechanism 30, the drive unit 23 driving each ultrasonic speaker 21, and the drive mechanism of the cleaning liquid discharge nozzle 60 are connected to a control part 50 and perform driving according to the command of the control part 50. The control part 50 is a computer including a CPU, which is a processor performing information processing, and a storage part 52 storing a control program and control data.

In the following, the operations of the acoustic cleaning apparatus 100 configured as the above will be described with reference to FIGS. 2 to 7. Firstly, the acoustic cleaning apparatus 100 described above is prepared (preparation step).

Figure 2:
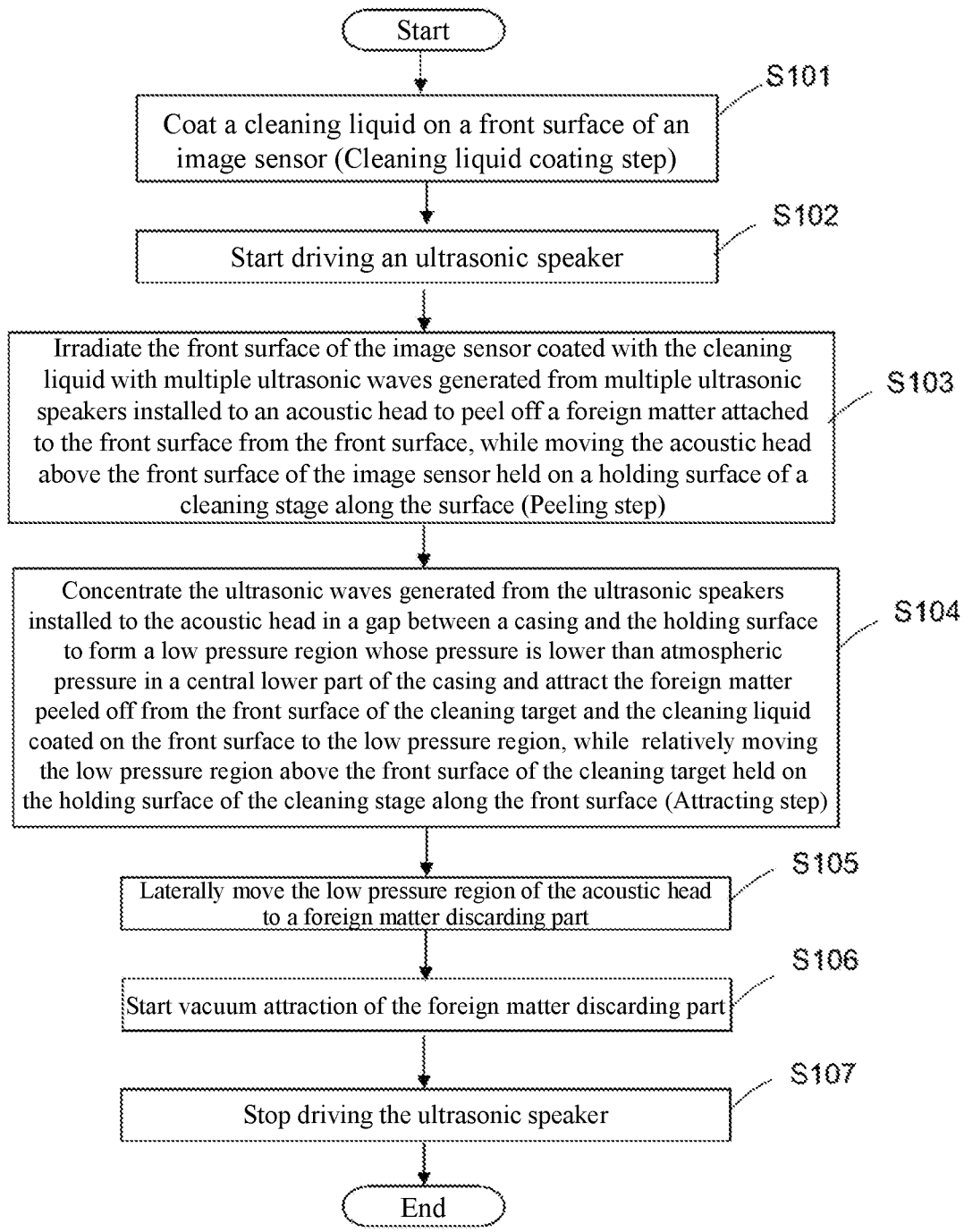
FIG. 2 is a flowchart illustrating respective steps when the ultrasonic cleaning method according to the embodiment is executed by using the acoustic cleaning apparatus shown in FIG. 1.
Figure 3:
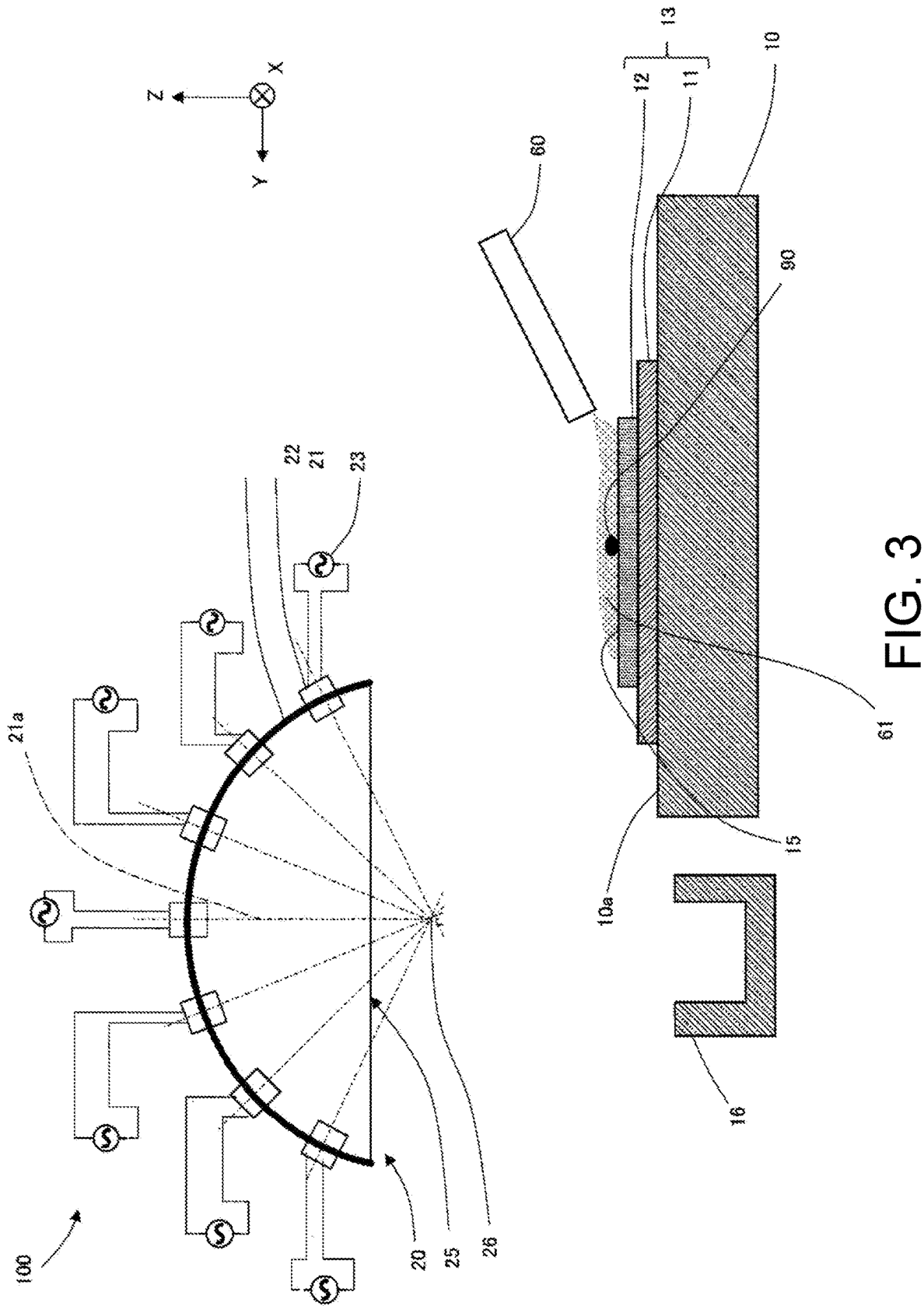
FIG. 3 is a perspective view illustrating the acoustic cleaning apparatus during execution of a cleaning liquid coating step of the ultrasonic cleaning method according to the embodiment.

In Step S101 of FIG. 2, as shown in FIG. 3, the control part 50 moves the acoustic head 20 next to the cleaning stage 10 by using the movement mechanism 30, drives a drive mechanism of the cleaning liquid discharge nozzle 60 not shown herein to discharge the cleaning liquid 61 from the tip, while making the tip of the cleaning liquid discharge nozzle 60 scan and move in XY direction above the front surface 15 of the image sensor 12 to coat the cleaning liquid 61 on the front surface 15 of the image sensor 12. As the cleaning liquid 61, various liquids may be used. For example, a solution of a surfactant may be used (cleaning liquid coating step).

Figure 4:
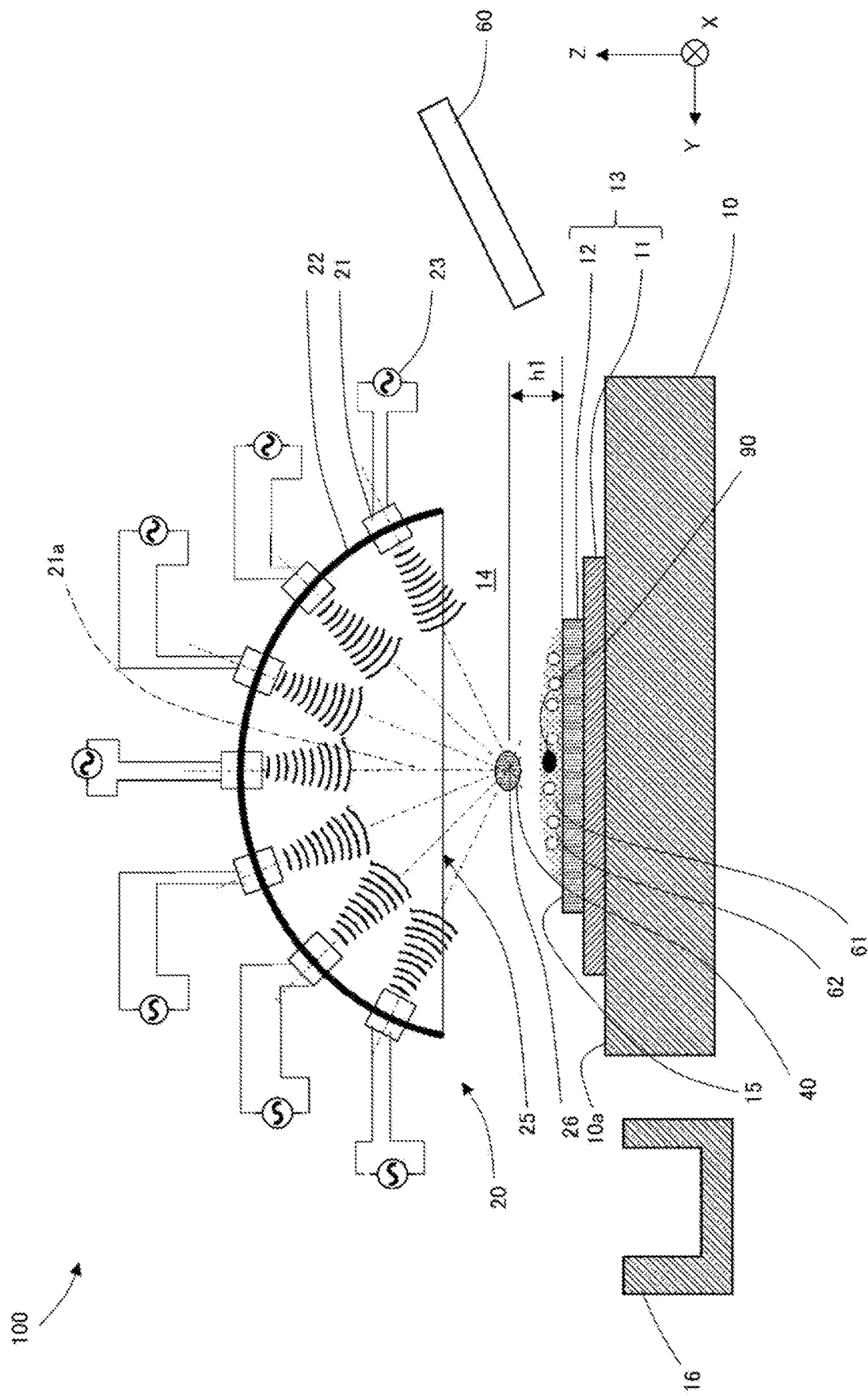
FIG. 4 is a perspective view illustrating the acoustic cleaning apparatus during execution of a peeling step of the ultrasonic cleaning method according to the embodiment.

As shown in FIG. 4, the control part 50 drives the drive mechanism, which is not shown in the drawing, of the cleaning liquid discharge nozzle 60 to move the cleaning liquid discharge nozzle 60 next to the cleaning stage 10, and moves the acoustic head 20 above the above of the cleaning stage 10. Then, as shown in Step S102 of FIG. 2, the control part 50 generates the ultrasonic waves 24 at a predetermined frequency from the respective ultrasonic speakers 21 by using the drive units 23. The respective ultrasonic speakers 21 are directional, and the ultrasonic waves propagate within the range of the directivity angle θ with the axes 21a as the centers in the directions of the respective axes 21a. Since the respective ultrasonic speakers 21 are installed to the casing 22 so that the respective axes 21a intersect at the spherical center 26 located at the central lower part of the casing 22, the ultrasonic waves 24 generated by the respective ultrasonic speakers 21 intersect and are concentrated and overlapped at the central lower part of the casing 22, or the gap 14. With the overlapping of the ultrasonic waves 24, a low pressure region 40 whose pressure is lower than the atmospheric pressure is formed at the central lower part of the casing 22. The low pressure region 40 has a diameter in a size about a half of the wavelength of the ultrasonic wave 24.

Then, in Step S103 of FIG. 2, as shown in FIG. 4, the control part 50 executes a peeling step, in which the control part 50 irradiates the front surface 15 of the image sensor 12 coated with the cleaning liquid 61 with the ultrasonic waves 24 generated by the ultrasonic speakers 21 installed to the acoustic head 20 to peel off a foreign matter 90 attached to the front surface 15 from the front surface 15, while moving the acoustic head 20 above the front surface 15 of the image sensor 12 held on the cleaning stage 10 along the front surface 15.

Through the reflection of the ultrasonic waves 24 from the front surface 15 of the image sensor 12, the low pressure region 40 is fixed at a height from a quarter to a half of the wavelength from the front surface 15 of the image sensor 12. The low pressure region 40 is a region held in a low pressure state whose pressure is lower than the atmospheric pressure, and is a region where the pressure variation due to the vibration of the ultrasonic waves 24 is little. Therefore, by keeping the acoustic head 20 so that a height h1 of the low pressure region 40 from the front surface 15 of the image sensor 12 is greater than a half of the wavelength of the ultrasonic wave 24, the control part 50 allows a region where the pressure variation due to the ultrasonic waves 24 is great to reach the front surface 15 of the image sensor 12, effectively generates cavitation in the cleaning liquid 61, and facilitates peeling of the foreign matter 90.

For example, in the case where the frequency of the ultrasonic wave 24 is 40 kHz, a half of the wavelength is 4.25 mm, and a quarter of the wavelength is 2.125 mm. Therefore, in the peeling step, the control part 50 holds the acoustic head 20 to scan and move in XY direction, so that the height h1 of the low pressure region 40 is 5 mm or more above the front surface 15 of the image sensor 12.

Accordingly, when the front surface 15 of the image sensor 12 is irradiated with the respective ultrasonic waves 24, as shown in FIG. 4, bubbles 62 are generated due to cavitation caused by ultrasonic waves 24 in the cleaning liquid 61. Then, due to the pressure variation and the temperature at the time when the bubbles 62 collapse, the foreign matter 90 attached to the front surface 15 of the image sensor 12 can be peeled off from the front surface 15. In addition, an organic substance attached to the front surface 15 of the image sensor 12 can be removed through cavitation, and the front surface 15 can be cleaned.

Figure 5:
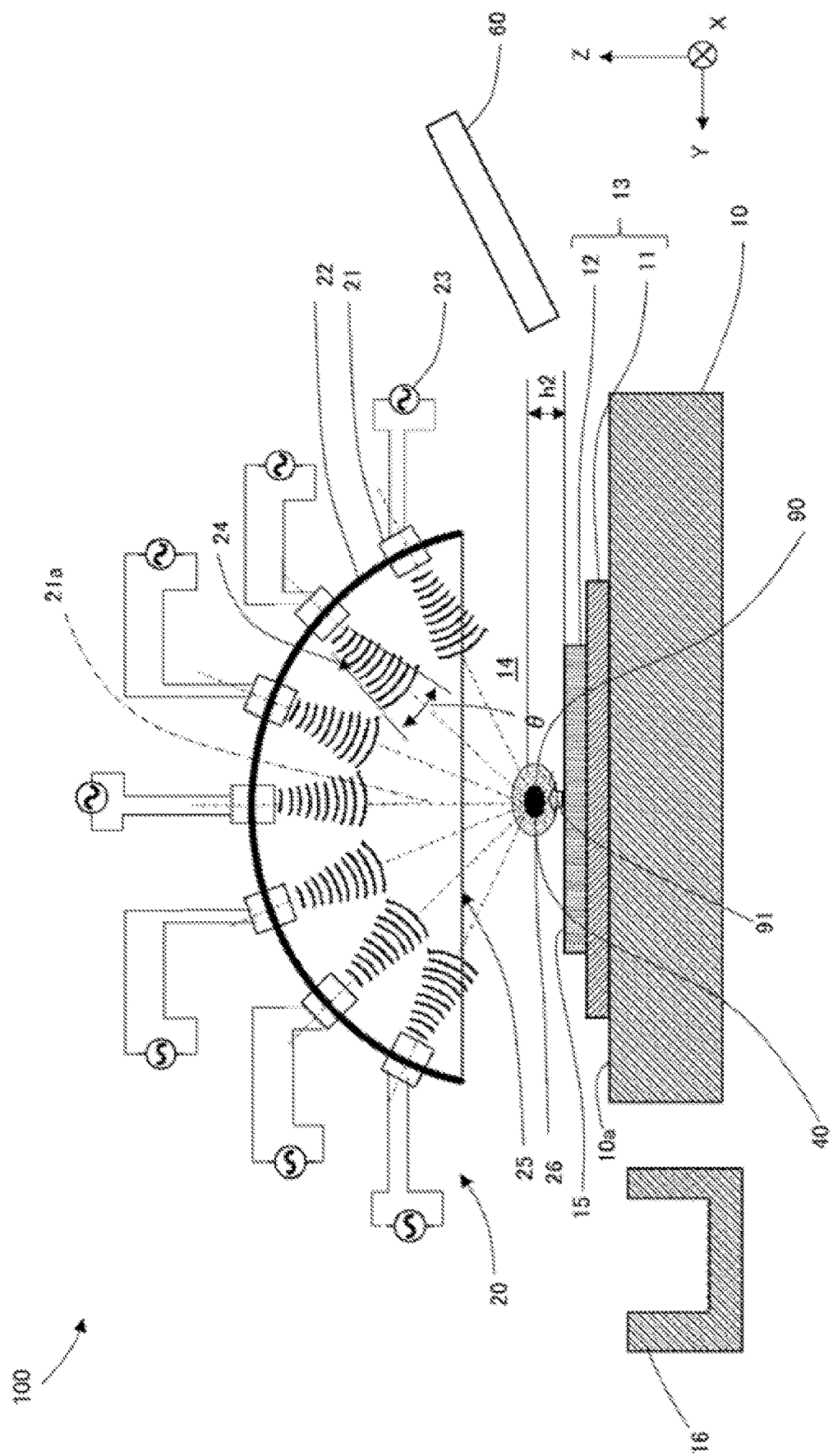
FIG. 5 is a perspective view illustrating the acoustic cleaning apparatus during execution of an attracting step of the ultrasonic cleaning method according to the embodiment.

Then, the control part 50 executes an attracting step shown in Step S104 of FIG. 2 and FIG. 5. In the attracting step, the low pressure region 40 is formed at the central lower part of the casing 22, and the foreign matter 90 peeled off from the front surface 15 of the image sensor 12 and the cleaning liquid 61 coated on the front surface 15 are attracted to the low pressure region 40, while the low pressure region 40 is moved relatively above the front surface 15 of the image sensor 12 held on the cleaning stage 10 along the front surface 15.

At this time, the movement mechanism 30 is operated so that a height h2 of the low pressure region 40 from the front surface 15 of the image sensor 12 is equal to or less than a half of the wavelength of the ultrasonic wave 24, and the acoustic head 20 scans and moves in XY direction above the image sensor 12. As described above, in the case where the frequency of the ultrasonic wave 24 is 40 kHz, a half of the wavelength is 4.25 mm. Therefore, the control part 50 holds so that the height of the low pressure region 40 from the front surface 15 of the image sensor 12 is at a location of about 1 to 5 mm and scans the acoustic head 20 in XY direction. Accordingly, since the low pressure region 40 is close to the front surface 15 of the image sensor 12, as shown in a hollow arrow sign 91 of FIG. 5, the foreign matter 90 peeled off from the front surface 15 of the image sensor 12 and the cleaning liquid 61 can be attracted to the low pressure region 40 together to be removed from the front surface 15. The foreign matter 90 and the cleaning liquid 61 attracted to the low pressure region 40 move together with the acoustic head 20 in a state of being captured in the low pressure region 40 and floating.

Figure 6:
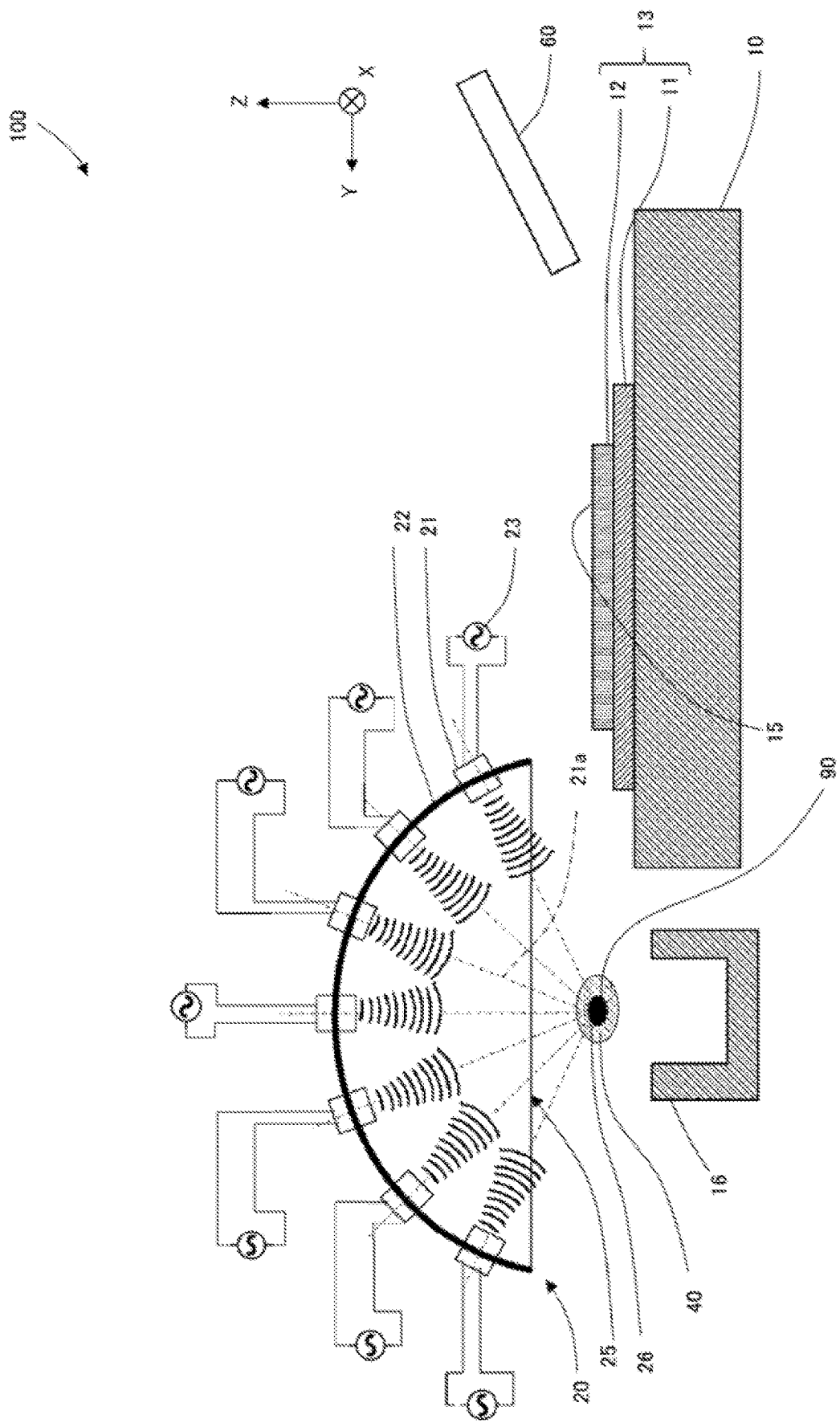
FIG. 6 is a perspective view illustrating the acoustic cleaning apparatus during execution of a discarding step of the ultrasonic cleaning method according to the embodiment.
Figure 7:
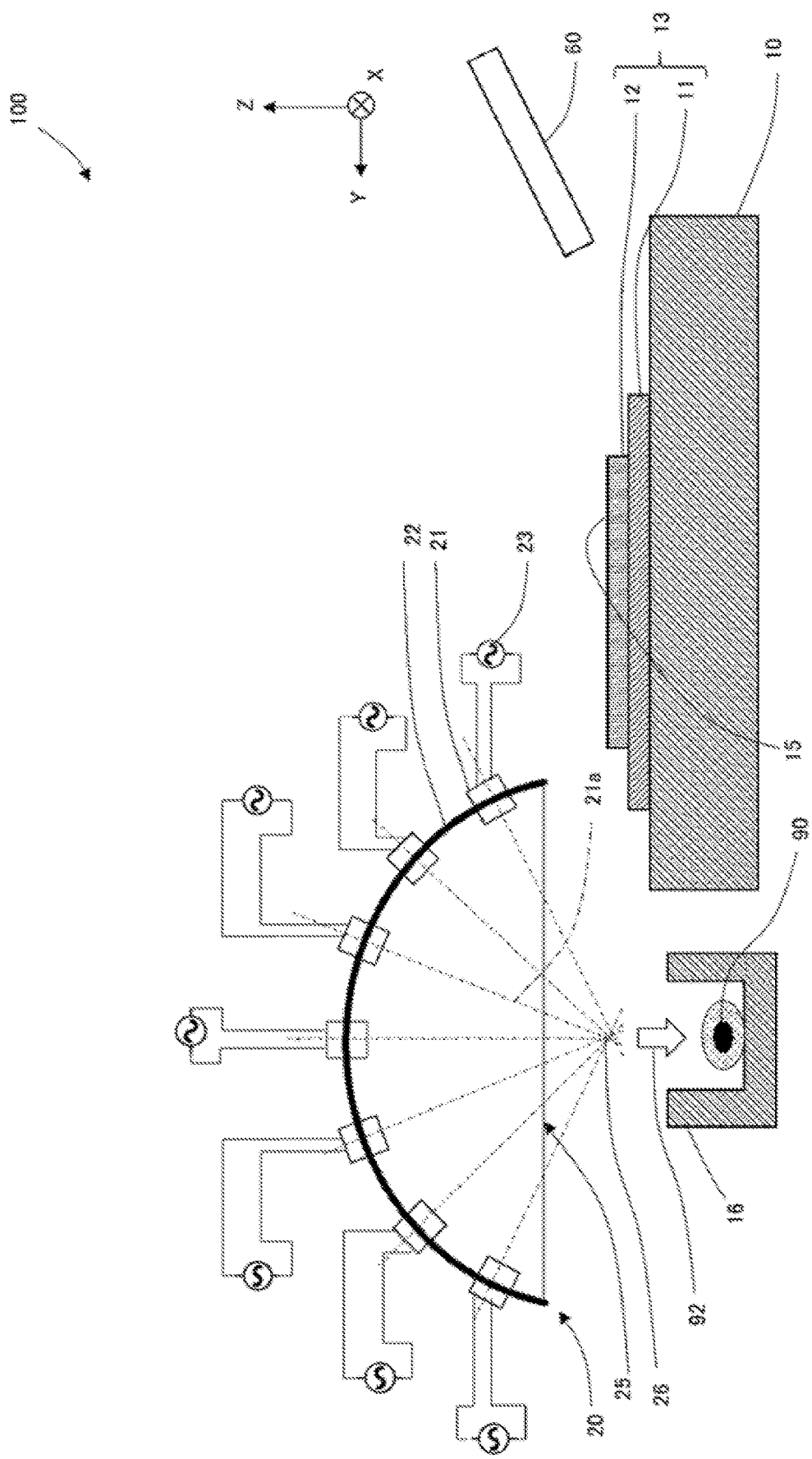
FIG. 7 is a perspective view illustrating the acoustic cleaning apparatus during execution of a discarding step of the ultrasonic cleaning method according to the embodiment.

If the control part 50 scans the acoustic head 20 in XY direction above the image sensor 12, as shown in Step S105 of FIG. 2 and FIG. 6, the acoustic head 20 is moved to the above of the foreign matter discarding part 16. Then, the control part 50 operates the vacuum attraction mechanism, which faces downward, of the foreign matter discarding part 16 as shown in Step S106 of FIG. 2, and, as shown in Step S107 of FIG. 2, the driving of the ultrasonic speakers 21 by the drive units 23 stops. Then, as shown in FIG. 7, the low pressure region 40 disappears, and the foreign matter 90 and the cleaning liquid 61 captured in the low pressure region 40 are attracted, in a direction of an arrow sign 92, through vacuum attraction to the foreign matter discarding part 16 on the lower side and be discarded to the outside (discarding step).

As described above, the ultrasonic cleaning method according to the embodiment can remove the foreign matter 90 without contacting the front surface 15 of the image sensor 12 and suppress the damage to the image sensor 12. In addition, since the front surface 15 of the image sensor 12 can be cleaned by using a simple configuration, the configuration can be assembled to a bonding apparatus, etc.

In the above description, in the peeling step, the acoustic head 20 is held to scan in XY direction so that the height h1 of the low pressure region 40 from the front surface 15 of the image sensor 12 is greater than a half of the wavelength of the ultrasonic wave 24, and in the attracting step, the acoustic head 20 is held to scan in XY direction so that the height h2 of the low pressure region 40 from the front surface 15 of the image sensor 12 is less than or equal to a half of the wavelength of the ultrasonic wave 24. However, the invention is not limited thereto.

For example, the acoustic head 20 may also be held to scan in XY direction, so that the height of the low pressure region 40 from the front surface 15 of the image sensor 12 is greater than a half of the wavelength of the ultrasonic wave 24 and less than the wavelength of the ultrasonic wave 24.

As described above, the low pressure region 40 is fixed at a height from a quarter to a half of the wavelength from the front surface 15 of the image sensor 12. Therefore, the acoustic head 20 is held so that the height of the low pressure region 40 from the front surface 15 of the image sensor 12 is greater than a half of the wavelength of the ultrasonic wave 24 and is less than the wavelength of the ultrasonic wave 24. Accordingly, although the low pressure region 40 becomes slightly distant from the front surface 15, and the attraction force is slightly lower than the above-described embodiment, with the height being greater than a half of the wavelength, the peeling of the foreign matter 90 attached to the front surface 15 can be facilitated. Accordingly, the peeling step and the attracting step can be performed at the same time, and the front surface 15 of the electronic component 13 can be cleaned within a short time.

What is claimed is:

1. An ultrasonic cleaning method for cleaning a front surface of a cleaning target, the acoustic cleaning method comprising:
   a preparation step, preparing an acoustic cleaning apparatus comprising: a cleaning stage, holding the cleaning target on a holding surface; and an acoustic head provided to be spaced apart from the cleaning stage and having: a plurality of ultrasonic wave generators being directional; and a casing to which the ultrasonic wave generators are installed, so that a plurality of ultrasonic waves generated from the acoustic generators are concentrated;
   a cleaning liquid coating step, coating a cleaning liquid on the front surface of the cleaning target held on the cleaning stage;
   a peeling step, after the cleaning liquid coating step, irradiating the front surface of the cleaning target coated with the cleaning liquid with the ultrasonic waves generated from the ultrasonic generators installed to the acoustic head, and peeling off a foreign matter attached to the front surface from the front surface; and
   an attracting step, concentrating the ultrasonic waves generated from the ultrasonic wave generators installed to the acoustic head at a gap between the casing and the holding surface of the cleaning stage to form a low pressure region whose pressure is lower than atmospheric pressure at the gap, and attracting the foreign matter peeled off from the front surface of the cleaning target and the cleaning liquid coated on the front surface to the low pressure region.

2. The ultrasonic cleaning method as claimed in claim 1, wherein the acoustic cleaning apparatus prepared in the preparation step comprises a movement mechanism moving relatively the acoustic head with respect to the cleaning target held on the cleaning stage, and
   the ultrasonic cleaning method comprises:
   in the peeling step, irradiating the front surface of the cleaning target with the ultrasonic waves while moving relatively the acoustic head with respect to the cleaning target held on the cleaning stage, via the gap, along the front surface; and in the attracting step, attracting the foreign matter peeled off from the front surface of the cleaning target and the cleaning liquid coated on the front surface to the low pressure region, while moving relatively the low pressure region above the front surface of the cleaning target held on the cleaning stage along the front surface.

3. The ultrasonic cleaning method as claimed in claim 2, comprising:
   in the peeling step, moving the acoustic head so that a height of the low pressure region from the front surface is greater than a half of a wavelength of the ultrasonic wave; and
   in the attracting step, moving the acoustic head so that the height of the low pressure region from the front surface is equal to or less than a half of the wavelength of the ultrasonic wave, wherein the attracting step is executed after the peeling step.

4. The ultrasonic cleaning method as claimed in claim 2, comprising:
moving the acoustic head so that a height of the low pressure region from the front surface is greater than a half of a wavelength of the ultrasonic wave and lower than the wavelength of the ultrasonic wave,
wherein the peeling step and the attracting step are executed at a same time.

* * * * *